(12) United States Patent
Ye et al.

(10) Patent No.: US 9,799,810 B1
(45) Date of Patent: Oct. 24, 2017

(54) LIGHT EMITTING DEVICE

(71) Applicant: HARVATEK CORPORATION, Hsinchu (TW)

(72) Inventors: Zhi-Ting Ye, Hsinchu (TW);
Shyi-Ming Pan, Hsinchu (TW);
Chia-Hung Pan, Hsinchu (TW);
Ping-Lung Wang, Hsinchu (TW)

(73) Assignee: HARVATEK CORPORATION, Hsnichu (TW)

( * ) Notice: Subject to any disclaimer, the term of this patent is extended or adjusted under 35 U.S.C. 154(b) by 0 days.

(21) Appl. No.: 15/473,624

(22) Filed: Mar. 30, 2017

(51) Int. Cl.
*H01L 33/00* (2010.01)
*H01L 33/60* (2010.01)
*H01L 33/48* (2010.01)
*H01L 33/54* (2010.01)
*H01L 33/50* (2010.01)
*H01L 33/44* (2010.01)

(52) U.S. Cl.
CPC ............. *H01L 33/60* (2013.01); *H01L 33/44* (2013.01); *H01L 33/486* (2013.01); *H01L 33/505* (2013.01); *H01L 33/54* (2013.01)

(58) Field of Classification Search
CPC ......... H01L 33/60; H01L 33/54; H01L 33/44; H01L 33/486; H01L 33/505
See application file for complete search history.

(56) References Cited

U.S. PATENT DOCUMENTS

| | | | |
|---|---|---|---|
| 8,079,737 B2* | 12/2011 | Wang | F21V 7/0008 362/296.1 |
| 2005/0169006 A1* | 8/2005 | Wang | F21K 9/00 362/555 |
| 2007/0133209 A1* | 6/2007 | Wang | F21K 9/233 362/294 |
| 2014/0307434 A1* | 10/2014 | Ye | F21K 9/50 362/235 |

* cited by examiner

*Primary Examiner* — Yosef Gebreyesus
(74) *Attorney, Agent, or Firm* — Steven Reiss

(57) ABSTRACT

A light emitting device includes a side-emitting assembly, a reflecting cup arranged on a side of the side-emitting assembly, and a package for accommodating the side-emitting assembly and the reflecting cup. The side-emitting assembly with a side surface includes a light emitting chip, a wavelength conversion layer coated on the light emitting chip, and a reflecting layer arranged above the wavelength conversion layer. The reflecting cup has an inner surface facing the side surface of the side-emitting assembly. The inner surface of the reflecting cup is a multifocal paraboloid. The multifocal paraboloid includes multistage paraboloids. The corresponding focal points of the multistage paraboloids are symmetrically distributed on the side surface of the side-emitting assembly.

20 Claims, 9 Drawing Sheets

LIGHT EMITTING DEVICE

FIELD

The subject matter herein generally relates to a light emitting device.

BACKGROUND OF THE INVENTION

Light emitting diode products can be seen everywhere, such as in traffic signals, automobile lamps, street lamps, lights or flashlights. These light emitting diode products always need to keep a narrow light exiting angle, so that the light emitted by the light emitting diode is more concentrated or focused. The light exiting angle of conventional light emitting diode is about 120 degrees, which is quite large. At present, the light emitting diode is usually combined with a reflecting structure to reduce the light exiting angle. However, an intervention of the reflecting structure would enlarge a total volume of light emitting diode product, thus it is not convenient for a user to carry. Moreover, it is difficult to align the light emitting diode with the reflecting structure during assembly.

At the present, the reflecting structure of the light emitting diode product is improved to reduce the volume of the light emitting diode product and to solve the alignment problem. For example, the reflecting structure arranges around a periphery of the light emitting diode, and the reflecting structure is configured as a paraboloid. However, since the light emitting diode is a plane light source or a body light source, rather than a desired point light source, the paraboloid with a single focal point still cannot achieve a well narrowed light emitting angle. As such, its condenser capacity is still limited.

The following detailed descriptions of exemplary embodiments are to be considered in combination with the accompanying figures. As will be realized, the subject matter disclosed and claimed is capable of modifications in various respects, all without departing from the scope of the claims. Accordingly, the drawings and the description are to be regarded as illustrative in nature, and not as restrictive in relation to the full scope of the subject matter as set forth in the claims.

SUMMARY

The present disclosure provides a light emitting device.

The light emitting device includes a side-emitting assembly with a side surface, a reflecting cup and a package. The side-emitting assembly includes a light emitting chip, a wavelength conversion layer coated on the light emitting chip and a reflecting layer arranged over the wavelength conversion layer. The reflecting cup is arranged around a periphery of the side surface of the side-emitting assembly. The package encapsulates the side-emitting assembly and the reflecting cup. The reflecting cup includes an inner surface facing the side surface of the side-emitting assembly. The inner surface of the reflector cup includes a multifocal paraboloid. The multifocal paraboloid includes multistage paraboloids, and each paraboloid has one or more focal points. The one or more focal points of the multistage paraboloids are symmetrically distributed on the side surface of the side-emitting assembly.

In an alternative exemplary embodiment, the wavelength conversion layer includes a second light emitting surface facing the inner surface of the reflector cup, where the side surface of the side-emitting assembly is located on the second light emitting surface of the wavelength conversion layer.

In an alternative exemplary embodiment, the side-emitting assembly further includes a light guiding layer, the light guiding layer includes a first outer side surface facing the inner surface of the reflector cup, where the side surface of the side-emitting assembly is located on the first outer side surface of the light guiding layer.

In an alternative exemplary embodiment, the light guiding layer is arranged between the reflecting layer and the wavelength conversion layer, where the light guiding layer is coated on the wavelength conversion layer.

In an alternative exemplary embodiment, the light guiding layer is arranged between the light emitting chip and the wavelength conversion layer, where the light guiding layer is coated on the light emitting chip.

In an alternative exemplary embodiment, the reflecting layer is made of a material selected from the group consisting of silicon dioxide, tin dioxide, zirconium dioxide, and a combination thereof.

In an alternative exemplary embodiment, the inner surface of the reflecting cup is made of a specular reflective material.

In an alternative exemplary embodiment, the specular reflective material is a metallic material, where the metallic material includes gold, silver, aluminum, chromium, copper, tin, or nickel.

In an alternative exemplary embodiment, each of the one or more focal points of the corresponding paraboloid of the multistage paraboloids is configured as a luminous spot of the side-emitting assembly.

In an alternative exemplary embodiment, a focal length of the multistage paraboloids increases gradually in a direction away from the light emitting chip.

In an alternative exemplary embodiment, the side surface of the side-emitting assembly has at least one symmetry plane, where an intersecting line is formed between the symmetry plane and the side surface of the side-emitting assembly, and where the corresponding one or more focal points of the multistage paraboloids are symmetrically distributed on the intersecting line.

In an alternative exemplary embodiment, the side-emitting assembly has a central axis, where the corresponding one or more focal points of the multistage paraboloids are symmetrically distributed on the side surface of the side-emitting assembly around the central axis.

In an alternative exemplary embodiment, the adjacent two paraboloids are symmetrical.

In an alternative exemplary embodiment, the multistage paraboloids are integrally formed. An adjacent pair of the paraboloids of the multistage paraboloids has a smoothly transition.

In an alternative exemplary embodiment, the multistage paraboloids include at least three parabolas.

In an alternative exemplary embodiment, the at least three paraboloids include a first paraboloid, a second paraboloid and a third paraboloid, where a focus of the first paraboloid is located at a position adjacent to a bottom portion of the light emitting chip, a focus of the third paraboloid is located at a position adjacent to a top portion of the wavelength conversion layer, and a focal point of the second paraboloid is located between the focal point of the first paraboloid and the focal point of the third paraboloid.

In an alternative exemplary embodiment, the package includes a light exiting surface, where the light exiting surface is a substantially planar, elliptical or semi-circular surface.

In an alternative exemplary embodiment, the package includes a first light guiding member and a second light guiding member formed on the first light guiding member, where the first light guiding member encapsulates the side-emitting assembly and the reflecting cup.

In an alternative exemplary embodiment, the first light guiding member includes a first light exiting surface, the first light exiting surface is a planar surface, where the second guiding member includes a second light exiting surface, the second light exiting surface is an elliptical or semi-circular surface.

In an alternative exemplary embodiment, a height from an apex of the first light exiting surface to the second light exiting surface represents a, and a width of the first light exiting surface represents b. A value of b/a is in a range of about $1.4 \leq b/a \leq 2$.

According to the light emitting device of the present disclosure, the light emitting device defines the side-emitting assembly, thus the length required for the reflecting cup can be reduced. In addition, the reflecting cup with multistage paraboloids, and the corresponding focal points of the multistage paraboloids are symmetrically distributed on the side surface of the side-emitting assembly, so the light emitted by the light-emitting device can be more concentrated.

BRIEF DESCRIPTION OF THE DRAWINGS

Implementations of the present technology will now be described, by way of example only, with reference to the attached figures.

DETAILED DESCRIPTION

Figure 1:
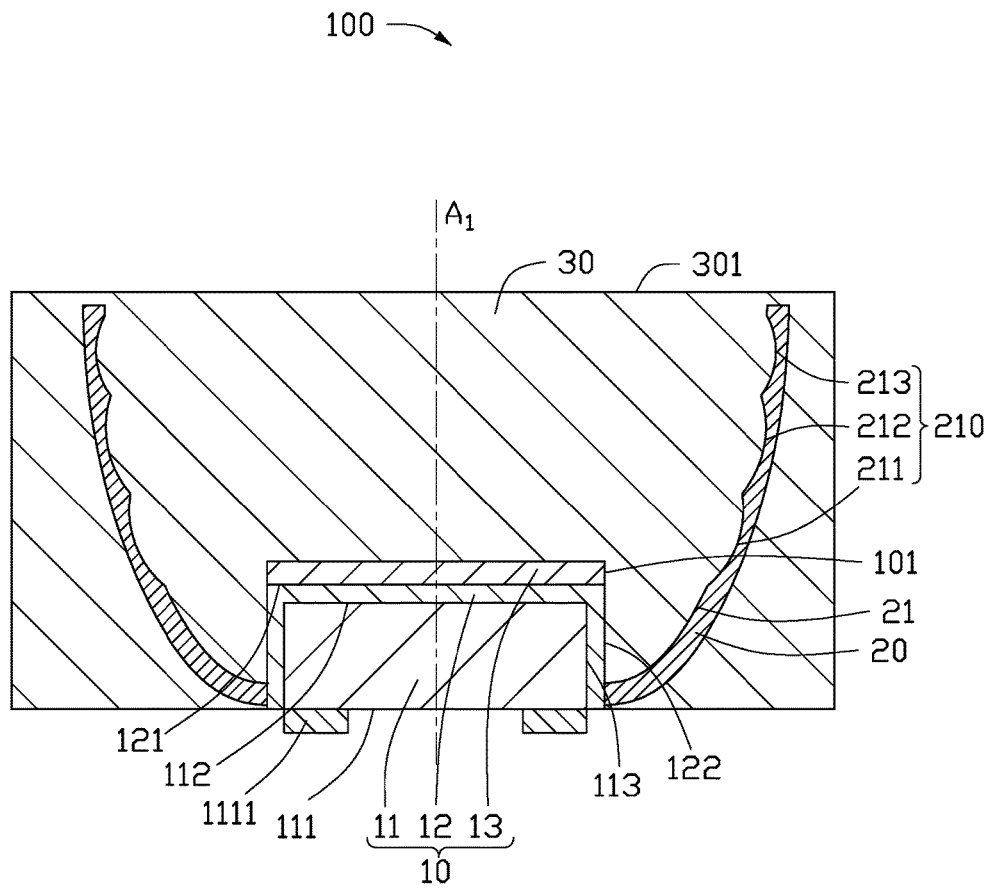
FIG. 1 is a schematic view of a light emitting device according to a first exemplary embodiment, the light emitting device including a side-emitting assembly and a reflecting cup.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" means essentially conforming to the particular dimension, shape or other feature that the term modifies, such that the component need not be exact. For example, "substantially cylindrical" means that the object resembles a cylinder, but may have one or more deviations from a true cylinder. The term "comprising" or "containing" when utilized, means "including, but not necessarily limited to"; it specifically indicates open-ended inclusion or membership in the so-described combination, group, series and the like. The term "directing" is intended to mean providing a path or passage for something from one position into a destination position. The terms "first", "second" and other terms in the present disclosure are only used as textual symbols as the circumstances may require, but such ordination is not limited to using only these terms. It should be further noted that these terms can be used interchangeably.

The present disclosure is described in relation to a light emitting device.

As shown in FIG. 1, in the first exemplary embodiment, a light emitting device 100 includes a side-emitting assembly 10, a reflecting cup 20 and a package 30. The reflecting cup 20 arranges around a periphery of the side-emitting assembly 10. The package 30 encapsulates the side-emitting assembly 10 and the reflecting cup 20.

The side-emitting assembly 10 has a side surface 101 and a central axis A1. The central axis A1 is in parallel with the side surface 101 of the side-emitting assembly 10. The side surface 101 of the side-emitting assembly 10 is configured as a symmetrical pattern. The side surface 101 is distributed symmetrically around the central axis A1, so that the light emitted from the light emitting chip 11 can be more uniformly emitted toward the side surface 101 of the side light emitting module 10. The side surface 101 of the side-emitting assembly 10 includes a plurality of light emitting points.

Figure 2A:
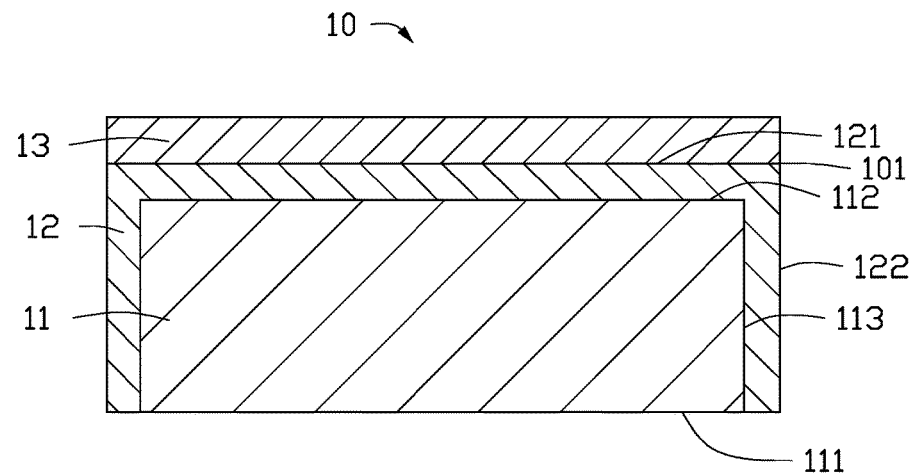
FIG. 2A is a schematic view of the side-emitting assembly in a first mode according to the first exemplary embodiment.

As shown in FIG. 1 and FIG. 2A, in a first mode, the side-emitting assembly 10 includes a light emitting chip 11, a wavelength conversion layer 12 and a reflecting layer 13. The wavelength conversion layer 12 is coated on the light emitting chip 11. The reflecting layer 13 is arranged on the wavelength conversion layer 12.

The light emitting chip 11 may be a horizontal type light emitting diode chip, a vertical type light emitting diode chip, a flip chip type light emitting diode chip, or any combination thereof. The type of light emitting chip 11 may be changed as desired by the user.

In the present exemplary embodiment, the light emitting chip 11 is preferably a flip chip type light emitting diode chip. The light-emitting chip 11 is configured as a planar light-emitting source emitting light. A light emitting surface of the planar light-emitting chip 11 including a first light emitting surface 112 and a second light emitting surface 113 of the light emitting chip 11.

The light emitting chip 11 includes a bottom surface 111, where the first light emitting surface 112 is aligned with the bottom surface 111. The second light emitting surface 113 is coupled to the bottom surface 111 and the first light emitting surface 112. The second light emitting surface 113 extends from a periphery of the first light emitting surface 112 toward in a direction of the bottom surface 111 of the light emitting chip 11.

As shown in FIG. 1, two connecting blocks 1111 are vertically protruded from the bottom surface 111 of the light emitting chip 11, on opposite sides of the central axis A1. The light emitting chip 11 is coupled to an external power source (not shown) by the two connection blocks 1111.

The wavelength conversion layer 12 is configured to convert the light emitted from the light emitting chip 11 to a specific wavelength. It should be noted that the wavelength conversion layer 12 can change the light wavelength of the light emitted by the light emitting chip 11 according to the preference of its user.

In the first mode, the wavelength conversion layer 12 is located on the first light emitting surface 112 of the light emitting chip 11, and covers the second light emitting surface 113 of the light emitting chip 11. Therefore, the light emitted from the light emitting chip 11 can be converted into a specific wavelength.

The wavelength conversion layer 12 includes a top surface 121 and a second side surface 122 coupled to the top surface 121. The first outer side surface 122 extends from a periphery of the top surface 121 toward in a direction of the light emitting chip 11. The second light emitting surface 113 of the light emitting chip 11 is aligned with the first outer side surface 122 of the wavelength conversion layer 12.

In the present exemplary embodiment, the second light emitting surface 113 of the light emitting chip 11 is parallel to the first outer side surface 122 of the wavelength conversion layer 12. The side surface 101 of the side-emitting assembly 10 is located on the first outer side surface 122 of the wavelength conversion layer 12. The reflecting surface 13 is located on the top surface 121 of the wavelength conversion layer 12.

The reflecting layer 13 may include, but is not limited to, silicon dioxide ($TiO_2$) tin dioxide ($SiO_2$), zirconium dioxide ($ZrO_2$), and any combination thereof.

A Part of the light emitted by the light emitting chip 11 passes through the first light emitting surface 112 of the light emitting chip 11, and then irradiates toward the reflecting layer 13. The light reflected by the reflecting layer 13 irradiates toward the wavelength conversion layer 12, and then passes through the first outer side surface 122 of the wavelength conversion layer 12. The other part of the light emitted by the light emitting chip 11 directly passes through the reflecting layer 13, and then emits toward the exterior of the side-emitting assembly 10, which in one exemplary implementation may account to about 20% of the light emitted by the light emitting chip 11. In addition, the further another part of the light emitted by the light emitting chip 11 directly passes through the second light emitting surface 113 of the light emitting chip 11, and the passes through the second light emitting surface 113 of the light emitting chip 11. Since most of the light emitted by the light emitting chip 11 passes through the first outer side surface 122 of the wavelength conversion layer 12, and then emits toward the exterior of the side-emitting assembly 10, so a required thickness of the reflecting cup 20 can be reduced, to facilitate a thin type of the light emitting device 100.

The present disclosure of the side-emitting assembly 10 can replace the conventional light emitting diode assembly. For example, a thickness of the package 30 can be reduced in a range of about 30 to about 50%. Therefore, the use of the side-emitting assembly 10 can realize a thin type of the light emitting device 100.

Figure 2B:
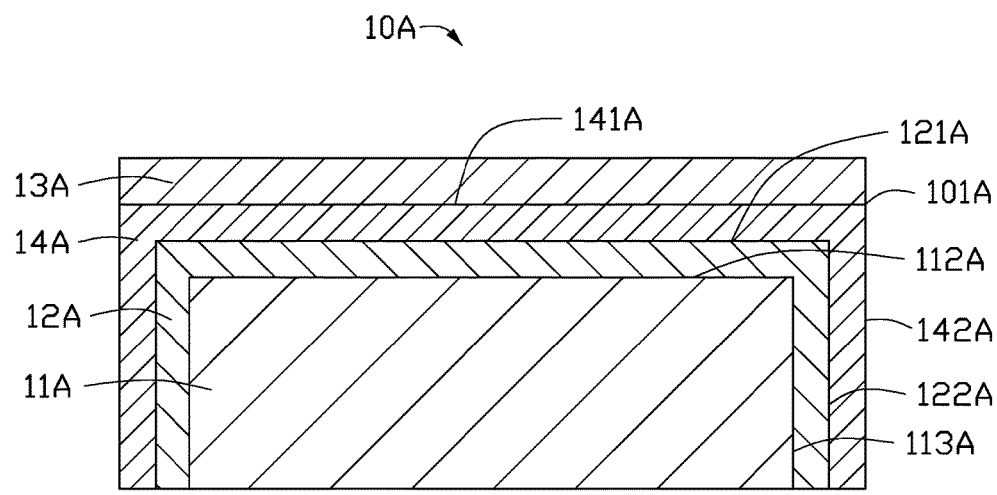
FIG. 2B is a schematic view of the side-emitting assembly in a second mode according to the first exemplary embodiment.

As shown in FIG. 2B, in a second mode, a side-emitting assembly 10A includes a light emitting chip 11A, a wavelength conversion layer 12A and a reflecting layer 13A. The light emitting chip 11A, the wavelength conversion layer 12A and the reflecting layer 13A may substantially correspond to the light emitting chip 11, the wavelength conversion layer 12, and the reflecting layer 13, respectively, shown in FIG. 2A of the first mode according to the first exemplary embodiment. The difference in a second mode according to the first exemplary embodiment is that the side-emitting assembly 10A further comprises a light guiding layer 14A arranged between the wavelength conversion layer 12A and the reflecting layer 13A.

The light guiding layer 14A includes a top surface 141A and a second outer side surface 142A coupled to the top surface 141A. The second outer side surface 142A extends from a periphery of the top surface 141A toward in a direction of the light emitting chip 11A. The second outer side surface 142A of the light guiding layer 14A is aligned with the first outer side surface 122A of the wavelength conversion layer 12A.

In the present exemplary embodiment, the second outer side surface 142A of the light guiding layer 14A is in parallel to the first outer side surface 122A of the wavelength conversion layer 12A. The reflecting surface 13A is located on the top surface 141A of the light guiding layer 14A, and the light guiding layer 14A covers the top surface 121A and the first outer side surface 122A of the wavelength conversion layer 12A. The side surface 101A of the side-emitting assembly 10A is located on the second outer side surface 142A of the light guiding layer 14A.

A material of the light guiding layer 14A may include, but is not limited to, silicone. It should be noted that the material of the light guiding layer 14A may include other light emitting materials that can guide the light emitted by the light emitting chip 11A and have high transparency. The light guiding layer 14A can be used to guide the light emitted by the light emitting chip 11A to a preset position, to adjust the irradiation range of the light.

Figure 2C:
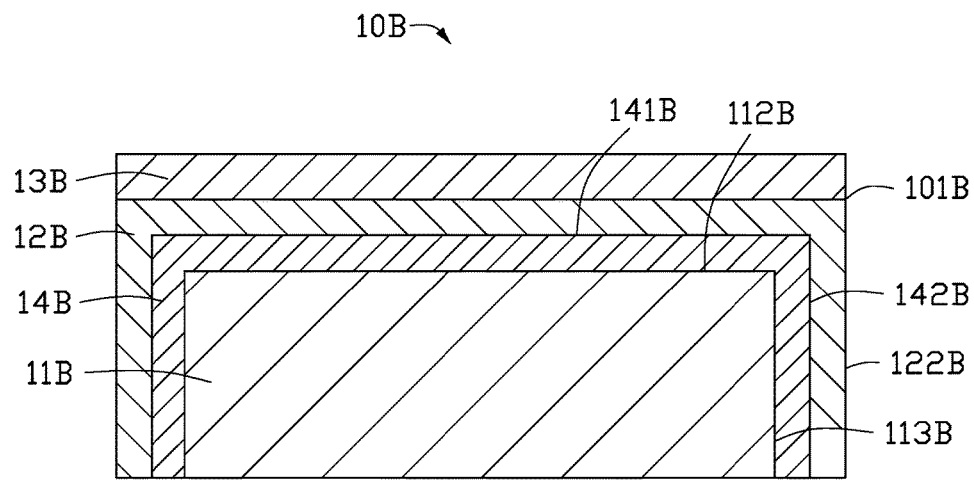
FIG. 2C is a schematic view of the side-emitting assembly in a third mode according to the first exemplary embodiment.

As shown in FIG. 2C, in a third mode, a side-emitting assembly 10B includes a light emitting chip 11B, a wavelength conversion layer 12B and a reflecting layer 13B. The light emitting chip 11B, the wavelength conversion layer 12B and the reflecting layer 13B may substantially correspond to the light emitting chip 11, the wavelength conversion layer 12 and the reflecting layer 13, respectively, shown in FIG. 2A of the first mode according to first exemplary embodiment. The difference in a third mode according to the first exemplary embodiment is that the side-emitting assembly 10B further comprises a light guiding layer 14B arranged between the light emitting chip 11B and the wavelength conversion layer 12B.

The light guiding layer 14B includes a top surface 141B and a second outer side surface 142B coupled to the top surface 141B. The second outer side surface 142B extends from a periphery of the top surface 141B toward in a direction of the light emitting chip 11B. The second outer side surface 142B of the light guiding layer 14B is located between the second light emitting surface 113B of the light emitting chip 11B the first outer side surface 122B of the wavelength conversion layer 12B.

In the present exemplary embodiment, the second outer side surface 142B of the light guiding layer 14B is in parallel to the second light emitting surface 113B of the light emitting chip 11B the first outer side surface 122B of the wavelength conversion layer 12B respectively. The reflecting surface 13B is located on the top surface 121B of the wavelength conversion layer 12B, and the light guiding layer 14B covers the top surface 112B and the second light emitting surface 113B of the light emitting chip 11B. The side surface 101B of the side-emitting assembly 10B is located on the first outer side surface 122B of the wavelength conversion layer 12B.

A material of the light guiding layer 14B may include, but is not limited to, silicone. It should be noted that the material of the light guiding layer 14B may include other light emitting materials that can guide the light emitted by the light emitting chip 11B and have high transparency. The light guiding layer 14B can be used to guide the light emitted by the light emitting chip 11B to a preset position, to adjust the irradiation range of the light.

Figure 2D:
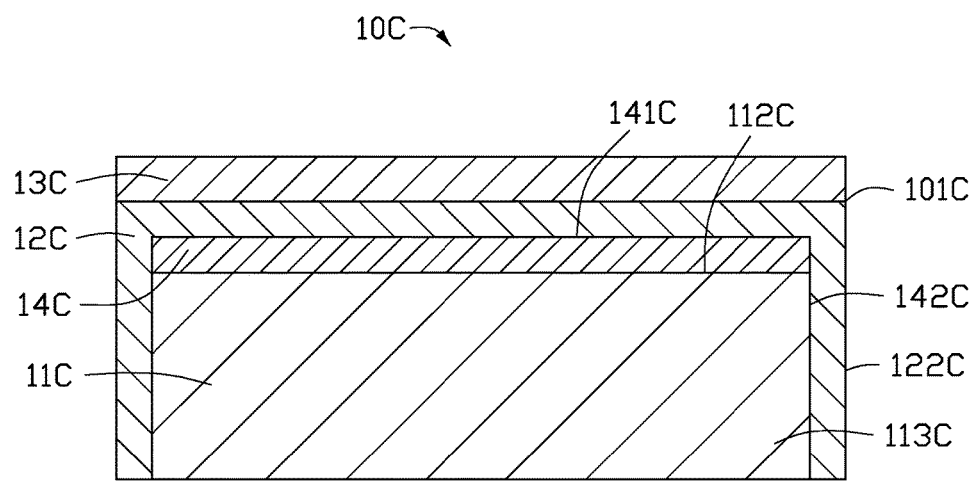
FIG. 2D is a schematic view of the side-emitting assembly in a fourth mode according to the first exemplary embodiment.

As shown in FIG. 2D, in a fourth mode, a side-emitting assembly 10C includes a light emitting chip 11C, a wavelength conversion layer 12C and a reflecting layer 13C. The light emitting chip 11C, the wavelength conversion layer 12C and the reflecting layer 13C may substantially correspond to the light emitting chip 11, the wavelength conversion layer 12 and the reflecting layer 13, respectively, shown in FIG. 2A of the first mode according to first exemplary embodiment. The difference in a fourth mode according to the first exemplary embodiment is that the side-emitting assembly 10C further comprises a light guiding layer 14C arranged on the light emitting chip 11C.

The light guiding layer 14C includes a top surface 141C and a second outer side surface 142C coupled to the top surface 141C. The second outer side surface 142C extends from a periphery of the top surface 141C toward in a direction of the light emitting chip 11C. The second outer side surface 142C of the light guiding layer 14C is flush with the second light emitting surface 113C of the light emitting chip 11C, and aligned with the first outer side surface 122C of the wavelength conversion layer 12C.

In the present exemplary embodiment, the second outer side surface 142C of the light guiding layer 14C is in parallel with the first outer side surface 122C of the wavelength conversion layer 12C. The reflecting surface 13C is located on the top surface 121C of the wavelength conversion layer 12C, and the wavelength conversion layer 12C covers the second light emitting surface 113C of the light emitting chip 11C, the top surface 141C, and the second outer side surface 142C of the light guiding layer 14C. The side surface 101C of the side-emitting assembly 10C is located on the first outer side surface 122C of the wavelength conversion layer 12C.

The material of the light guiding layer 14C may include, but is not limited to, silicone. It should be noted that the material of the light guiding layer 14C may include other light emitting materials that can guide the light emitted by the light emitting chip 11C and have high transparency. The light guiding layer 14C can be used to guide the light emitted by the light emitting chip 11C to a preset position, to adjust the irradiation range of the light.

Figure 3:
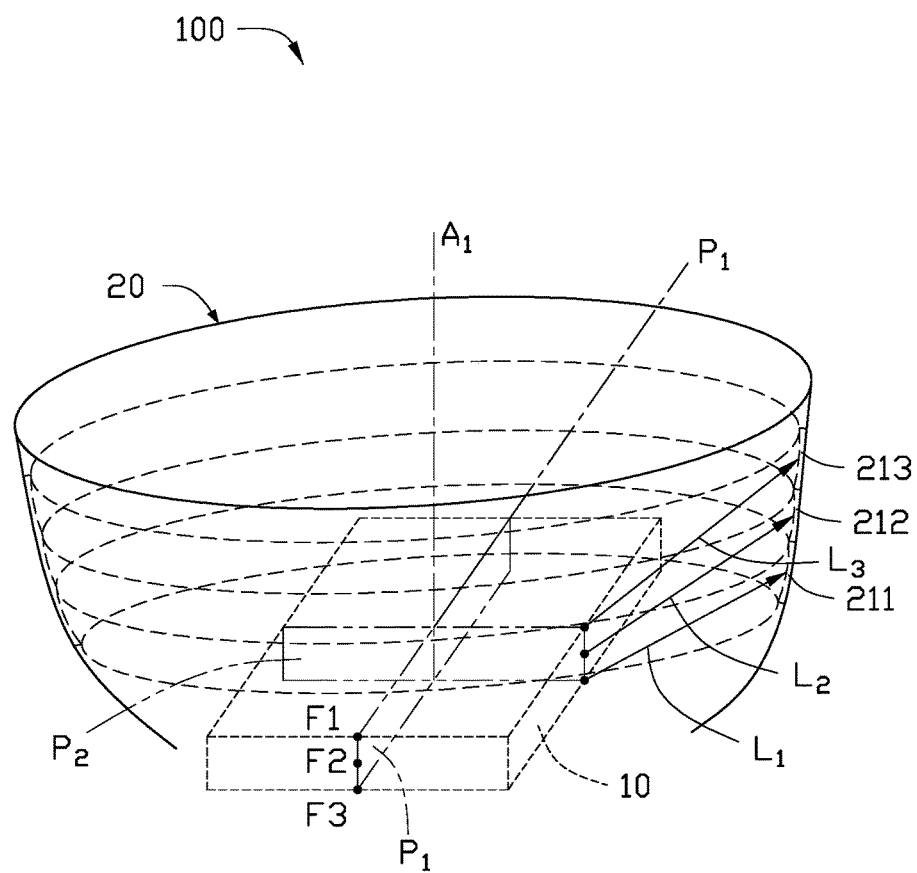
FIG. 3 is a perspective and schematic view of the side-emitting assembly and the reflecting cup according to a second exemplary embodiment.

As shown in FIG. 3, the side-emitting assembly 10 has a symmetrical plane. In the first embodiment, the side-emitting assembly 10 is symmetrical under all rotations about a symmetrical plane of the side-emitting assembly 10. The symmetrical plane includes a first symmetrical plane P1 and a second symmetrical plane P2. The first symmetrical plane P1 and the second symmetrical plane P2 are perpendicular to each other. The central axis A1 is located at the intersection of the first symmetrical plane P1 and the second symmetrical plane P2, and perpendicular to both the first symmetrical plane P1 and second symmetrical plane P2.

The reflecting cup 20 is configured as a bowl-shaped body having a multifocal paraboloid. A width of the cross-section of the reflecting cup 20 is gradually increased in a direction away from the light emitting chip 11, to facilitate an improvement of the light emitting efficiency of the light-emitting device 100.

As shown in FIG. 1 to FIG. 4, the reflecting cup 20 includes an inner surface 21 facing the side surface 101 of the light emitting chip 11. The inner surface 21 of the reflecting cup 20 is made of a specular reflective material. In the present exemplary embodiment, the specular reflective material may be a metalliclic material. The metallic material may include, but is not limited to, gold, silver, aluminum, chromium, copper, tin, or nickel.

In FIG. 3, the inner surface 21 of the reflecting cup 20 includes multistage paraboloids 210. The multistage paraboloids 210 include one or more focal points. The one or more focal points of the multistage paraboloids 210 are arranged are symmetrically distributed around the central axis A1 and spaced apart from each other, that is, the one or more focal points of the multistage paraboloids 210 do not overlap each other. The one or more focal points of the multistage paraboloids 210 are symmetrically distributed on the side surface 101 of the side-emitting assembly 10.

A first intersecting line (not shown) is formed between the side surface 101 of the side-emitting assembly 10 and the first symmetrical plane P1 and the second symmetrical plane P2. A second intersecting line (not shown) is formed between the side surface 101 of the side-emitting assembly 10 and the second symmetrical plane P2. The corresponding focal points of the multistage paraboloids 210 are preferably and symmetrically distributed on the first and second intersecting lines, respectively. Therefore, the light emitted by the light emitting chip 11 can be uniformly irradiated to the exterior of light emitting device 100.

In the first embodiment, a first intersecting line (not shown) is formed between the side surface 101 of the side-emitting assembly 10 and the first symmetrical plane P1, and a second intersecting line (not shown) is formed between the side surface 101 of the side-emitting assembly 10 and the second symmetrical plane P2. The corresponding focal points of the multistage paraboloids 210 are symmetrically distributed on the first intersecting line (not shown) and the second intersecting line (not shown).

The corresponding focal lengths of the multistage paraboloids 210 increase gradually in a direction away from the light emitting chip 11. Therefore, the light emitted by the light emitting chip 11 is reflected by the multistage paraboloids 210 of the reflecting cup 20, to achieve a centralized irradiation of the light emitting device 100.

Figure 4:
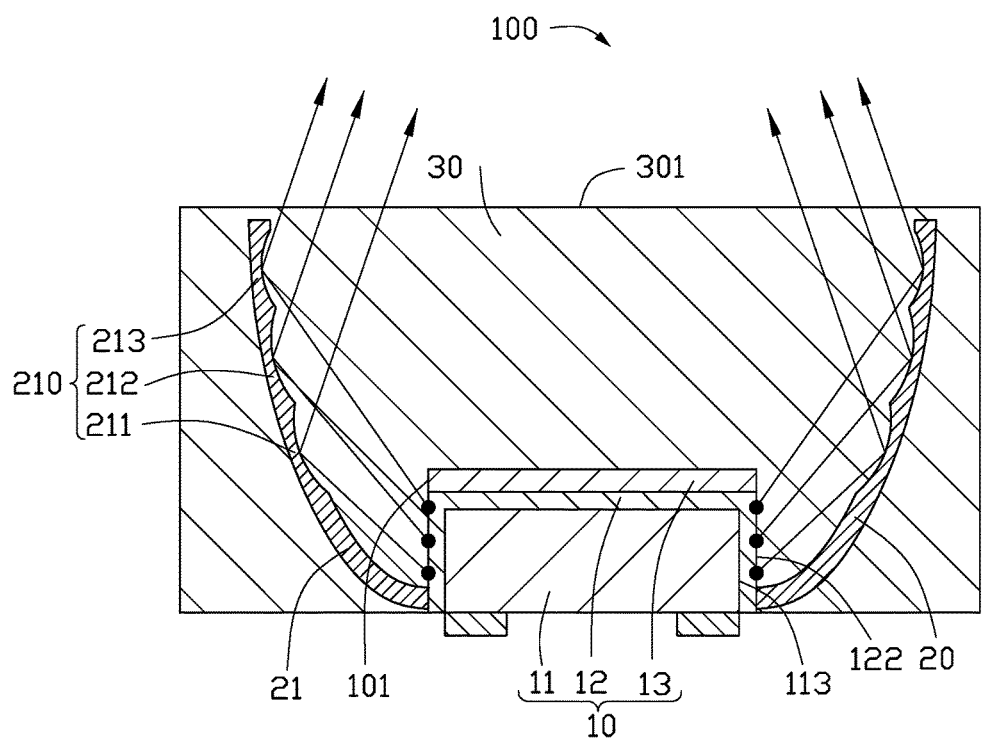
FIG. 4 is a schematic view of a light path of the light emitting device according to a first exemplary embodiment.

FIG. 4 shows a cross-sectional view of the light emitting device 100. Each paraboloid 210 has two symmetrical focal points and two symmetrical focal lengths. The one or more focal points of the multistage paraboloids 210 located on the side surface 101 of the side-emitting assembly 10 are symmetrical distribution around the central axis A1. The cross section of the multistage paraboloids 210 has a first side and a second side. The one or more focuses of the multistage paraboloids 210 in the first side or the second side form a straight line, respectively. The corresponding focus lengths of the multistage paraboloids 210 are different from each other in a direction away from the light emitting chip 10.

It can be understood that two adjacent paraboloids of the multistage paraboloids 210 are substantially symmetrical under a normal (not shown) of the multistage paraboloids 210. Curvature of each paraboloid may be substantially consistent. An adjacent pair of the paraboloids of the multistage paraboloids 210 has a smoothly transition. The multistage paraboloids 210 are integrally formed.

In a preferred exemplary embodiment, the multistage paraboloids 210 include at least three paraboloids. In the present exemplary embodiment, the multistage paraboloids 210 include a first paraboloid 211, a second paraboloid 212, and a third paraboloid 213. The first paraboloid 211, the second paraboloid 212, and the third paraboloid 213 are arranged in a smooth transition in a direction away from the light emitting chip 11 in sequence. The first paraboloid, the second paraboloid 212, and the third paraboloid 213 are each symmetrical distribution taking from the central axis A1 of the side-emitting assembly 10.

As shown in FIG. 3 and FIG. 4, in the first embodiment, a cross section of the first paraboloid 211 taken from the first or second symmetrical planes P1, P2 has two symmetrical first focal points F1 and two symmetrical first focal lengths L1. A longitudinal plane of the second paraboloid 212 taken from the first or second symmetrical planes P1, P2 has two symmetrical second focal points F2 and two symmetrical second focal lengths L2. A longitudinal plane of the third paraboloid 213 taken from the first or second symmetrical planes P1, P2 has two symmetrical third focal points F3 and two symmetrical third focal lengths L3. The corresponding focal lengths of the multistage paraboloids have a relationship, such as: L3>L2>L1.

The first, second, and third focal points F1, F2, F3 are symmetrically distributed on the intersecting line formed between the side surface 101 of the side-emitting assembly 10 and the symmetrical plane. The first focus F1, the second focus F2, and the third focus F3 are linearly related on a side of the central axis A1 of the side-emitting assembly 10. The first focus F1, the second focus F2, and the third focus F3 are aligned in a straight line, and the straight line is in parallel to the central axis A1 of the side-emitting assembly 10.

In one embodiment, the first focus F1 may be located at the first outer side surface 122 of the wavelength conversion layer 12 adjacent to a bottom portion of the light emitting chip 11. The third focus F3 may be located at the first outer side surface 122 of the wavelength conversion layer 12 adjacent to a top portion of the wavelength conversion layer 12. The second focus F2 may be located at the first outer side surface 122 of the wavelength conversion layer 12, and the second focus F2 is located at an intermediate position between the first focus F1 and the second focus F2.

As shown in FIG. 2B, in another embodiment, the first focus (not shown) may be located at the second outer side surface 142A of the light guiding layer 14A adjacent to a bottom portion of the light emitting chip 11. The third focus (not shown) may be located at the second outer side surface 142A of the light guiding layer 14A adjacent to a top portion of the light guiding layer 14A. The second focus (not shown) may be located at the second outer side surface 142A of the light guiding layer 14A, and the second focus (not shown) is located at an intermediate position between the first focus (not shown) and the second focus (not shown).

The shape of the multistage paraboloids 210 can be calculated according to a different position of the light emitting chip 11 and a different requirement of the light. The corresponding focal points of the multistage paraboloids 210 are symmetric around the central axis A1. The side-emitting assembly 10 is located at a symmetrical center of the corresponding focal points, to allow the corresponding focal points of the multistage paraboloids 210 to be symmetrically distributed on the side surface 101 of the side-emitting assembly 10.

A suitable size and shape of the light emitting chip 11 can be selected according to a shape of the reflecting cup 20, to facilitate the uniform illumination and the full utilization of the light emitted by the emitting chip 11. In addition, the shape of the multistage paraboloids 210 can be selected according to the shape of the light emitting chip 11, and a user can adjust a length and an opening of the multistage paraboloids 210, to achieve a good lighting effect of the light emitted by the lighting device 100.

The package 30 is covered the side-emitting assembly 10 and the reflective cup 20. The package 30 may be configured as a light guiding member. In the embodiment, the package 30 is filled on two sides of the reflecting cup 20. The side side-emitting assembly 10 and the reflecting cup 20 are sealed by the package 30 to form a specific shape, such as a cuboid, or a cube.

The package 30 is configured to fix the side-emitting assembly 10 and the reflective cup 20, and adjust a relative position between the side-emitting assembly 10 and the reflective cup 20. In other words, the reflecting cup 20 is located at a predetermined position via the package 30, to allow the corresponding focal points of the multistage paraboloids 210 to fall on the side face 101 of the side-emitting assembly 10. The package 30 is further configured to guide the light emitted by the light emitting chip 11 to a preset position, to adjust the irradiation range of the light.

A material of the package 30 may include, but is not limited to, silicone. It should be noted that the material of the package 30 may include other light guiding materials that can guide the light emitted by the light emitting chip 11 and have high transparency.

A top portion of the package 30 arranges a light emitting surface 301 facing the light emitting surface 113 of the light emitting chip 11.

In order to improve the light-emitting efficiency of the light-emitting device 100, the light emitting surface 301 may be substantially, but is not limited to, a planar, elliptical or semi-circular surface.

The light emitting surface 301 may preferably be the elliptical or semi-circular surface, to allow the light emitted by the light emitting chip 11 and fails to irradiate toward the reflecting cup 20 to be refracted, so the light emitted by the light-emitting device 100 can be more concentrated.

The reflective cup 20 includes a top end opposite to the side-emitting assembly 10 and a bottom end adjacent to the side-emitting assembly 10. A bottom portion of the light exiting surface 301 of the package 30 may be substantially flush with or higher than a top end of the reflective cup 20. Therefore, the light emitted by the light emitting chip 11 may accurately reach the preset position of the multistage paraboloids 210 of the reflecting cup 20 through the package 30, and the light emitted by the light emitting device 100 is more concentrated. The side-emitting assembly 10 and the reflecting cup 20 are encapsulated by the package 30 to achieve an accurate alignment.

In the embodiment, the light exiting surface 301 is the planar surface, and the light exiting surface 301 is flush with the top end of the reflective cup 20, to facilitate a thin type of the light emitting device 100.

FIG. 4 shows a light path of the light emitted by the light emitting device 100. The light emitting chip 11 emits light. Most of the light emitted by the light emitting chip 11 irradiates toward the reflecting layer 13. The light reflected by the reflecting layer 13 passes through the first outer side surface 122 of the wavelength conversion layer 12, and then irradiates toward the inner surface 21 of the reflecting cup 20. The light reflected by the multistage paraboloids 210 of the reflecting cup 20 passes through the light exiting surface 301 of the package 30. The light emitting device 100 can reduce the light exiting angle of the light emitted by the light emitting chip 11, and the light emitted by the light emitting chip 11 can intensely irradiate toward the exterior of the light emitting device 100.

Figure 5:
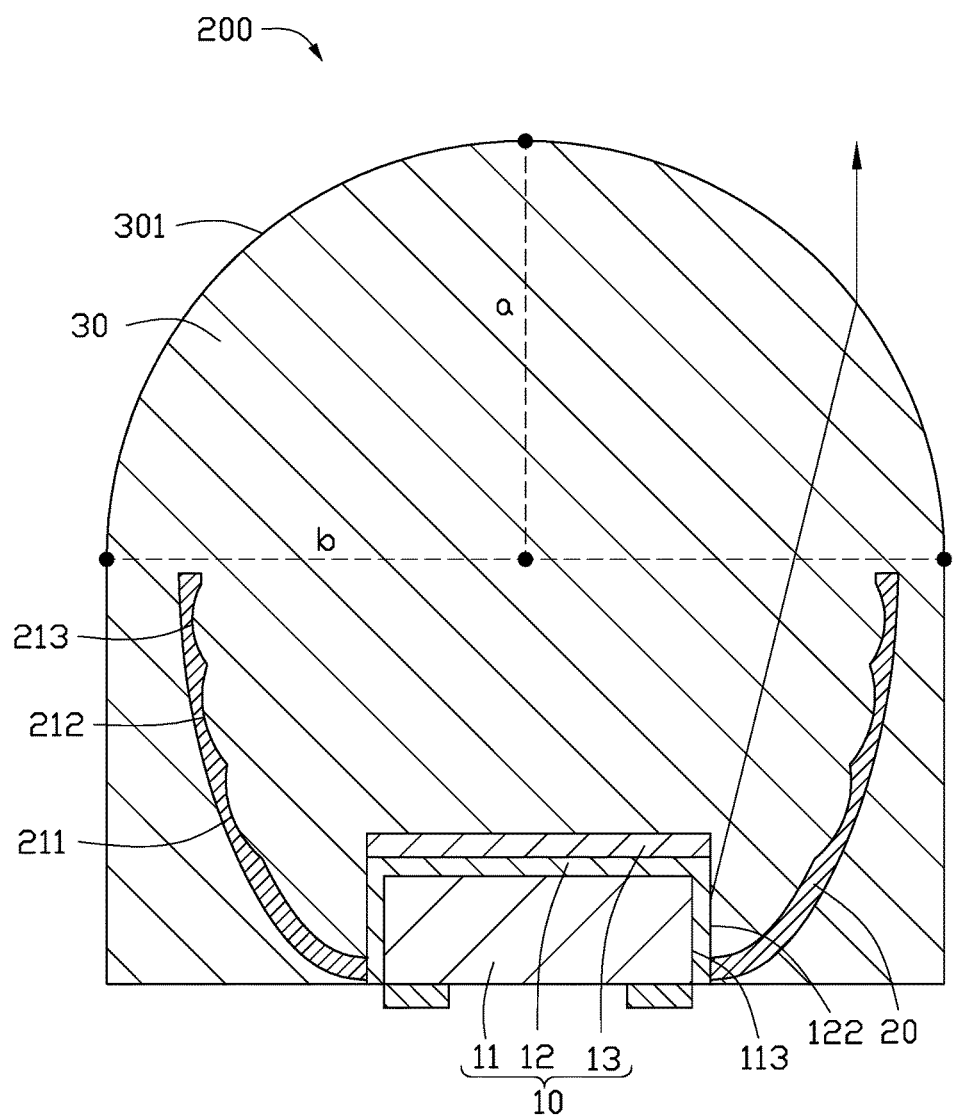
FIG. 5 is a schematic view of a light emitting device according to a second exemplary embodiment.

As shown in FIG. 5, in a second embodiment, the light emitting device 200 includes a side-emitting assembly 10, a reflecting cup 20 and a package 30. The side-emitting assembly 10, the reflecting cup 20 and the package 30 are consistent features among the structures of the first exemplary embodiment. The difference in the second exemplary embodiment is that the light exiting surface 301 of the package 30 is a semi-circular surface.

A bottom end of the semi-circular surface is flush with the top end of the reflecting cup 20. A height from an apex of the light exiting surface 301 to the bottom end of the semi-circular surface 301 represents a, and a width of the bottom end of the light exiting surface 301 represents b, and wherein a value of b/a is in a range of about $1.4 \leq b/a \leq 2$.

It should be noted that, in the embodiment, the side-emitting assembly 10 may change according to the first exemplary embodiment in the above modes or a combination thereof.

Figure 6:
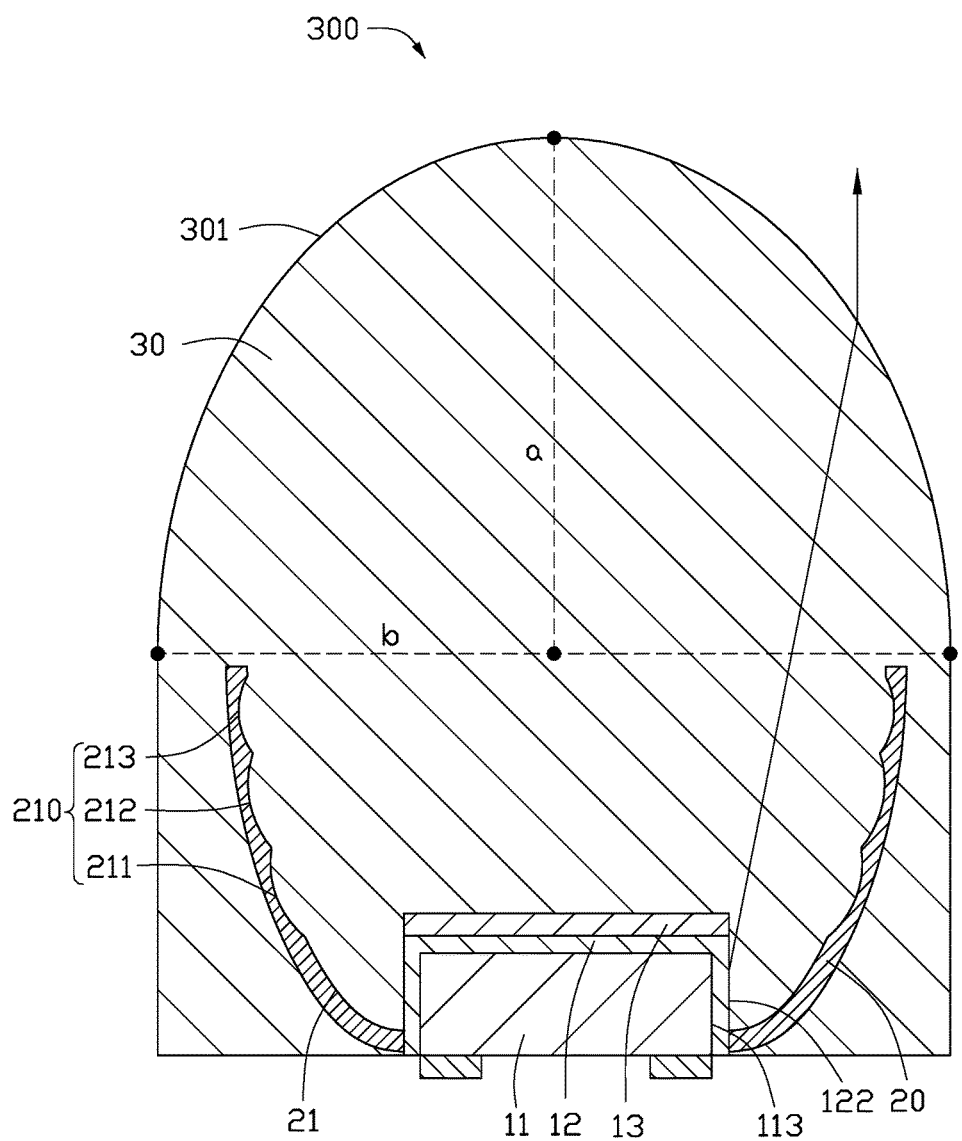
FIG. 6 is a schematic view of a light emitting device according to a third exemplary embodiment.

As shown in FIG. 6, in a third embodiment, the light emitting device 300 includes a side-emitting assembly 10, a reflecting cup 20 and a package 30. The side-emitting assembly 10, the reflecting cup 20 and the package 30 are consistent features among the structures of the first exemplary embodiment. The difference in the third exemplary embodiment is that the light exiting surface 301 of the package 30 is an elliptical surface.

A bottom end of the elliptical surface is flush with the top end of the reflecting cup 20. A height from an apex of the elliptical surface to the bottom end of the elliptical surface represents a, and a width of the bottom end of the elliptical surface represents b, and wherein a value of b/a is in a range of about $1.4 \leq b/a \leq 2$.

It should be noted that, in the embodiment, the side-emitting assembly 10 may change according to the first exemplary embodiment in the above modes or a combination thereof.

Figure 7:
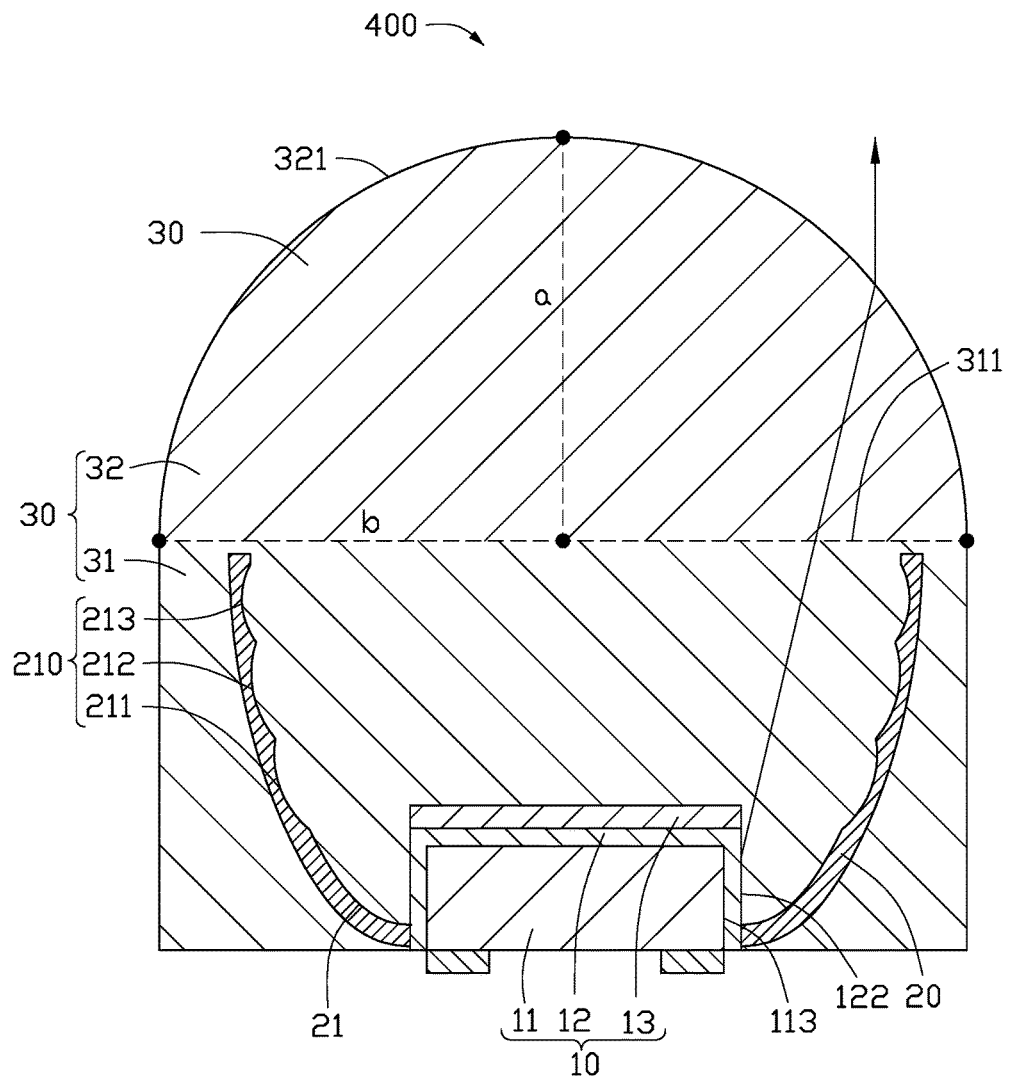
FIG. 7 is a schematic view of a light emitting device according to a fourth exemplary embodiment.

As shown in FIG. 7, in a fourth embodiment, the light emitting device 400 includes a side-emitting assembly 10, a reflecting cup 20 and a package 30. The side-emitting assembly 10, the reflecting cup 20 and the package 30 are consistent features among the structures of the first exemplary embodiment. The difference in the fourth exemplary embodiment is that the package 30 includes a first light guiding member 31 and a second light guiding member 32 arranged over the first light guiding member 31.

The first light guiding member 31 includes a first light exiting surface 311. The first light exiting surface 311 may be, but is not limited to, a planar surface.

The second light guiding member 32 includes a second light exiting surface 321 coupled to the second light exiting surface 321. The second light exiting surface 321 may be, but is not limited to, an elliptical or semi-circular surface.

The first light exiting surface is flush with the top end of the reflecting cup 20. A height from an apex of the second light exiting surface 321 to the first light exiting surface 311 represents a, and a width of the first light exiting surface 311 represents b, and wherein a value of b/a is in a range of about $1.4 \leq b/a \leq 2$.

It should be noted that, in the embodiment, the side-emitting assembly 10 may change according to the first exemplary embodiment in the above modes or a combination thereof.

Figure 8:
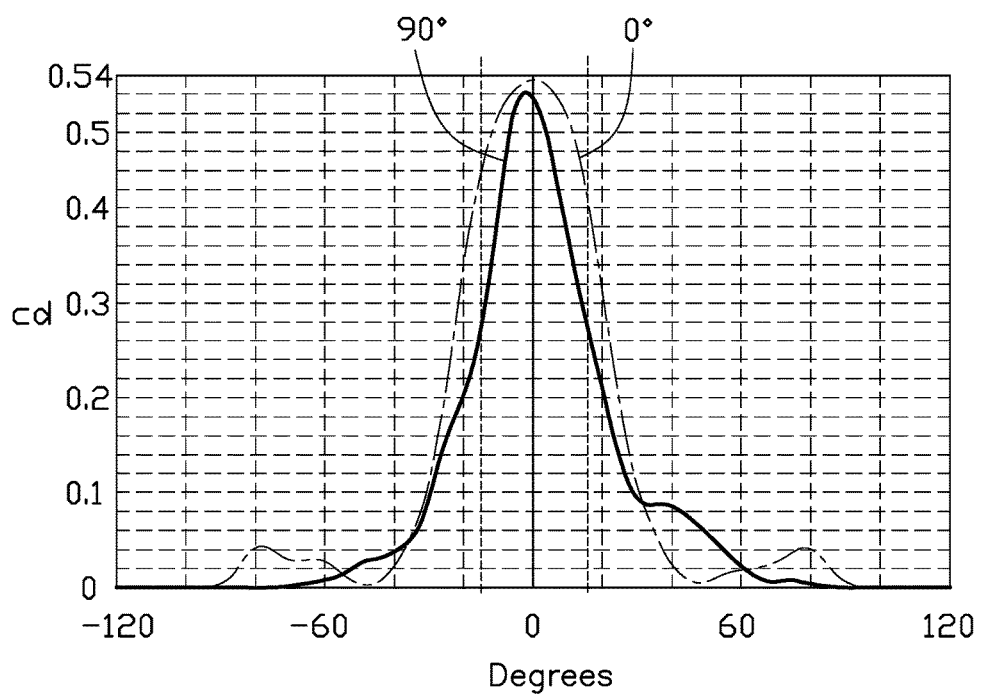
FIG. 8 is a graph of the light exiting angle of the light emitting device according to the first exemplary embodiment.

FIG. 8 shows the assay results of the light emitting angles of the light emitted by the light emitting device 100 according to the first embodiment of the present invention. The experiment is divided into Groups 1 and 2, wherein the measured angle of the light emitting device 100 is at 0 degree in Group 1, and the measured angle of the light emitting device 100 is at 90 degree in Group 2. The measured angle is defined as a tester measuring the light emitting angle of the light emitting device 100 at a relative position. Specifically, the 0 degree represents the tester selected one position of the second light emitting surface of the light emitting chip (represent here as: a first simulation test position), the 90 degrees represents a second simulation test position relative to the first simulation test position rotated 90 degrees. It can be seen from Group 1 and the Group 2 that the light emitting angle of the light emitted by the light emitting device 100 is less than about 20 degrees. The result here shows that the light emitted by the light emitting device 100 is more concentrated because the light emitting angle of the light emitting device 100 is reduced, so the light emitted by the light emitting device 100 can be irradiated to a longer distance. Further, the light emitting device may be applied to a high beam lamp.

The exemplary embodiments illustrated and described above are only examples. Many details are often found in the art such as the other features of a light emitting device. Therefore, many such details are neither illustrated nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A light emitting device comprising:
   a side-emitting assembly with a side surface, the side-emitting assembly comprising;
      a light emitting chip;
      a wavelength conversion layer, coated on the light emitting chip; and
      a reflecting layer, arranged over the wavelength conversion layer;
   a reflecting cup, arranged around a periphery of the side surface of the side-emitting assembly; and
   a package, encapsulating the side-emitting assembly and the reflecting cup,
   wherein the reflecting cup comprises an inner surface facing the side surface of the side-emitting assembly;
   wherein the inner surface of the reflector cup comprises a multifocal paraboloid, and wherein the multifocal paraboloid comprises multistage paraboloids;
   wherein each paraboloid has one or more focal points;

wherein the one or more focal points of the corresponding paraboloid of the multistage paraboloids are symmetrically distributed on the side surface of the side-emitting assembly.

2. The light emitting device of claim 1, wherein the wavelength conversion layer comprises a second light emitting surface facing the inner surface of the reflector cup, and wherein the side surface of the side-emitting assembly is located on the second light emitting surface of the wavelength conversion layer.

3. The light emitting device of claim 1, wherein the side-emitting assembly further comprises a light guiding layer, the light guiding layer comprises a first outer side surface facing the inner surface of the reflector cup, and wherein the side surface of the side-emitting assembly is located on the first outer side surface of the light guiding layer.

4. The light emitting device of claim 3, wherein the light guiding layer is arranged between the reflecting layer and the wavelength conversion layer, and wherein the light guiding layer is coated on the wavelength conversion layer.

5. The light emitting device of claim 3, wherein the light guiding layer is arranged between the light emitting chip and the wavelength conversion layer, and wherein the light guiding layer is coated on the light emitting chip.

6. The light emitting device of claim 1, wherein the reflecting layer is made of a material selected from the group consisting of silicon dioxide, tin dioxide, zirconium dioxide, and a combination thereof.

7. The light emitting device of claim 1, wherein the inner surface of the reflecting cup is made of a specular reflective material.

8. The light emitting device of claim 7, wherein the specular reflective material is a metallic material, and wherein the metallic material comprises gold, silver, aluminum, chromium, copper, tin, or nickel.

9. The light emitting device of claim 1, wherein each of the one or more focal points of the corresponding paraboloid of the multistage paraboloids is configured as a luminous spot of the side-emitting assembly.

10. The light emitting device of claim 1, wherein a focal length of the multistage paraboloids increases gradually in a direction away from the light emitting chip.

11. The light emitting device of claim 1, wherein the side surface of the side-emitting assembly has at least one symmetry plane, and wherein an intersecting line is formed between the symmetry plane and the side surface of the side-emitting assembly, and wherein the corresponding one or more focal points of the multistage paraboloids are symmetrically distributed on the intersecting line.

12. The light emitting device of claim 1, wherein the side-emitting assembly has a central axis, and wherein the corresponding one or more focal points of the multistage paraboloids are symmetrically distributed on the side surface of the side-emitting assembly around the central axis.

13. The light emitting device of claim 1, wherein the adjacent two paraboloids are substantially symmetrical.

14. The light emitting device of claim 1, wherein the multistage paraboloids are integrally formed, and wherein an adjacent pair of the paraboloids of the multistage paraboloids has a smoothly transition.

15. The light emitting device of claim 1, wherein the multistage paraboloids comprise at least three paraboloids.

16. The light emitting device of claim 15, wherein the at least three paraboloids comprise a first paraboloid, a second paraboloid and a third paraboloid, and wherein a focal point of the first paraboloid is located at a position adjacent to a bottom portion of the light emitting chip, a focal point of the third paraboloid is located at a position adjacent to a top portion of the wavelength conversion layer, and a focal point of the second paraboloid is located between the focal point of the first paraboloid and the focal point of the third paraboloid.

17. The light emitting device of claim 1, wherein the package comprises a light exiting surface, and wherein the light exiting surface is a substantially planar, elliptical or semi-circular surface.

18. The light emitting device of claim 1, wherein the package comprises a first light guiding member and a second light guiding member formed on the first light guiding member, and wherein the first light guiding member encapsulates the side-emitting assembly and the reflecting cup.

19. The light emitting device of claim 18, wherein the first light guiding member comprises a first light exiting surface, the first light exiting surface is planar surface, and wherein the second guiding member comprises a second light exiting surface, the second light exiting surface is an elliptical or semi-circular surface.

20. The light emitting device of claim 19, wherein a height from an apex of the first light exiting surface to the second light exiting surface represents a, and a width of the first light exiting surface represents b, and wherein a value of b/a is in a range of $1.4 \leq b/a \leq 2$.

* * * * *